US011573273B2

(12) United States Patent
Wei et al.

(10) Patent No.: US 11,573,273 B2
(45) Date of Patent: Feb. 7, 2023

(54) METHOD, APPARATUS, DEVICE AND MEDIUM FOR ESTIMATING PERFORMANCE PARAMETERS OF A BATTERY

(71) Applicant: Contemporary Amperex Technology Co., Limited, Ningde (CN)

(72) Inventors: Yimin Wei, Ningde (CN); Zhen Lin, Ningde (CN); Xingsheng Wei, Ningde (CN)

(73) Assignee: Contemporary Amperex Technology Co., Limited, Ningde (CN)

( * ) Notice: Subject to any disclaimer, the term of this patent is extended or adjusted under 35 U.S.C. 154(b) by 0 days.

(21) Appl. No.: 17/561,750

(22) Filed: Dec. 24, 2021

(65) Prior Publication Data

US 2022/0120815 A1    Apr. 21, 2022

Related U.S. Application Data

(63) Continuation of application No. PCT/CN2020/132902, filed on Nov. 30, 2020.

(30) Foreign Application Priority Data

Mar. 30, 2020    (CN) .......................... 202010238115.X

(51) Int. Cl.
    *G01R 31/388*    (2019.01)
    *G01R 31/367*    (2019.01)
    *G01R 31/36*     (2020.01)

(52) U.S. Cl.
    CPC ......... *G01R 31/388* (2019.01); *G01R 31/367* (2019.01); *G01R 31/3648* (2013.01)

(58) Field of Classification Search
    None
    See application file for complete search history.

(56) References Cited

U.S. PATENT DOCUMENTS 9,091,735 B2 *   7/2015   Wang ................... G01R 31/367
2013/0110428 A1  5/2013   Sun et al.
(Continued)

FOREIGN PATENT DOCUMENTS

CN    106125007 A    11/2016
CN    106680725 A    5/2017
(Continued)

OTHER PUBLICATIONS

The extended European search report for EP Application No. 20920755.4, dated Mar. 25, 2022, 5 pages.
(Continued)

*Primary Examiner* — Mischita L Henson
(74) *Attorney, Agent, or Firm* — East IP P.C.

(57) ABSTRACT

The present application discloses a method, apparatus, device and medium for estimating performance parameters of a battery. The method for estimating performance parameters of a battery includes: generating a first curve segment to be calibrated during a process of adjusting a battery capacity in a first capacity interval with a first capacity value as an endpoint value; determining, in a preset reference curve, a first target curve segment that matches the first curve segment to be calibrated; determining a SOC interval corresponding to the first target curve segment as a SOC interval of the first curve segment to be calibrated; and estimating the performance parameters of the battery based on the SOC interval of the first curve segment to be calibrated, the performance parameters include a current SOC and/or a current battery capacity.

11 Claims, 7 Drawing Sheets

(56) References Cited

U.S. PATENT DOCUMENTS

| | | | |
|---|---|---|---|
| 2015/0070024 A1* | 3/2015 | Kim | H01M 10/48 324/430 |
| 2016/0049821 A1* | 2/2016 | Aridome | H02J 7/0047 320/128 |
| 2016/0061908 A1 | 3/2016 | Torai et al. | |
| 2019/0277917 A1* | 9/2019 | Chan | G01R 31/3835 |
| 2020/0004306 A1 | 1/2020 | Uan-Zo-Li | |
| 2020/0011933 A1* | 1/2020 | Otagiri | G01R 31/388 |
| 2022/0299569 A1* | 9/2022 | Kurtz | B64D 43/00 |

FOREIGN PATENT DOCUMENTS

| | | |
|---|---|---|
| CN | 107656210 A | 2/2018 |
| CN | 107831442 A | 3/2018 |
| CN | 107843845 A | 3/2018 |
| CN | 108226783 A | 6/2018 |
| CN | 108303658 A | 7/2018 |
| CN | 108318819 A | 7/2018 |
| CN | 108732500 A | 11/2018 |
| CN | 108931739 A | 12/2018 |
| CN | 109298348 A | 2/2019 |
| CN | 109356293 A | 2/2019 |
| CN | 109669131 A | 4/2019 |
| CN | 110646741 A | 1/2020 |
| CN | 110824363 A | 2/2020 |
| CN | 112513656 A | 3/2021 |
| DE | 102013206189 A1 | 10/2014 |
| EP | 3579007 A1 | 12/2019 |
| JP | 2014119331 A | 6/2014 |
| JP | 2016053564 A | 4/2016 |
| WO | 2017016385 A1 | 2/2017 |
| WO | 2018126901 A1 | 7/2018 |

OTHER PUBLICATIONS

The International search report for PCT Application No. PCT/CN2020/132902, dated Feb. 2, 2021, 15 pages.
The first Official Action and supplemental search report dated Jul. 28, 2022 for Chinese Application No. 202010238115.X, 13 pages.
Xu Shouping et al., "Study of SOC Estimation Algorithm for Energy Storage Lithium Battery Pack Based on Information Fusion Technology", Power System Technology, vol. 40 No. 6, dated Jun. 2016, 6 Pages.
Pengbo Ren, "Research on capacity estimation and SOH prediction for lithium-ion battery based on SOC interval stress",Chinese Doctoral Dissertations Full-text Database (Master), No. 1, dated Jan. 15, 2020, 92 Pages.

\* cited by examiner

METHOD, APPARATUS, DEVICE AND MEDIUM FOR ESTIMATING PERFORMANCE PARAMETERS OF A BATTERY

CROSS-REFERENCE TO RELATED APPLICATION

The present application is a continuation of International Application No. PCT/CN2020/132902, filed on Nov. 30, 2020, which claims priority to Chinese Patent Application No. 202010238115.X filed on Mar. 30, 2020, titled "METHOD, APPARATUS, DEVICE AND MEDIUM FOR ESTIMATING PERFORMANCE PARAMETERS OF A BATTERY", both of the applications are incorporated herein by reference in their entireties.

TECHNICAL FIELD

The present application relates to the technical field of batteries, and in particular, to a method, apparatus, device and medium for estimating performance parameters of a battery.

BACKGROUND

With the development of new energy, the new energy has been adopted as power in more and more fields. Due to the advantages of high energy density, recyclable charging, safety and environmental protection and the like, batteries are widely used in the fields of new energy vehicles, consumer electronics, energy storage systems and the like.

In order to be able to use a battery more effectively, reasonably and safely, it is necessary to accurately calculate performance parameters of the battery during the use of the battery. Therefore, a solution that can accurately calculate the performance parameters of the battery is needed.

SUMMARY

In a first aspect, embodiments of the present application provide a method for estimating performance parameters of a battery, including: generating a first curve segment to be calibrated during a process of adjusting a battery capacity in a first capacity interval with a first capacity value as an endpoint value, the first curve segment to be calibrated represents an actual change of the battery capacity in the first capacity interval with a voltage; determining, in a preset reference curve, a first target curve segment that matches the first curve segment to be calibrated, the preset reference curve represents a reference change of the battery capacity with a voltage within an output voltage range of the battery; determining a state of charge (SOC) interval corresponding to the first target curve segment as a SOC interval of the first curve segment to be calibrated; and estimating the performance parameters of the battery based on the SOC interval of the first curve segment to be calibrated, the performance parameters include a current SOC and/or a current battery capacity.

In a second aspect, embodiments of the present application provide an apparatus for estimating performance parameters of a battery, including: a first curve generation module configured to generate a first curve segment to be calibrated during a process of adjusting a battery capacity in a first capacity interval with a first capacity value as an endpoint value, the first curve segment to be calibrated represents an actual change of the battery capacity in the first capacity interval with a voltage; a first matching module configured to determine, in a preset reference curve, a first target curve segment that matches the first curve segment to be calibrated, the preset reference curve represents a reference change of the battery capacity with a voltage within an output voltage range of the battery; a first SOC interval determination module configured to determine a state of charge (SOC) interval corresponding to the first target curve segment as a SOC interval of the first curve segment to be calibrated; and a first performance parameter estimation module configured to estimate the performance parameters of the battery based on the SOC interval of the first curve segment to be calibrated, the performance parameters include a current SOC and/or a current battery capacity.

In a third aspect, a device for estimating performance parameters of a battery is provided, and the device includes: a memory configured to store a program; and a processor configured to run the program stored in the memory to execute the method for estimating performance parameters of a battery provided by the first aspect or any optional implementation of the first aspect.

In a fourth aspect, a computer storage medium is provided, and the computer storage medium has stored computer program instructions thereon that, when executed by a processor, realize the method for estimating performance parameters of a battery provided by the first aspect or any optional implementation of the first aspect.

BRIEF DESCRIPTION OF THE DRAWINGS

The drawings that need to be used in embodiments of the present application are introduced briefly below to illustrate technical solutions of the embodiments of the present application more clearly. For those ordinary skilled in the art, other drawings may be obtained based on those drawings without any creative work.

DETAILED DESCRIPTION

Figure 1:
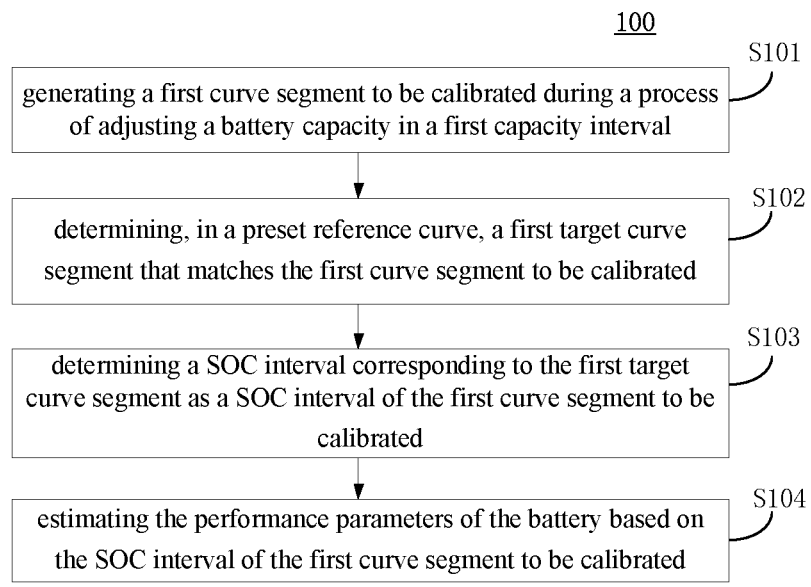
FIG. 1 is a schematic flowchart of a first method for estimating performance parameters of a battery provided by an embodiment of the present application.

The implementation of the present application will be described in further detail below in conjunction with the drawings and embodiments. The detailed description and drawings of the following embodiments are used to exemplarily illustrate the principle of the present application, but cannot be used to limit the scope of the present application, that is, the present application is not limited to the described embodiments.

In the description of the present application, it should be noted that, unless otherwise stated, "a plurality" means two or more; an orientation or positional relationship indicated by the terms "upper", "lower", "left", "right", "inside" and "outside" is only for the convenience of describing the present application and simplifying the description, rather than indicating or implying that the referred apparatus or element must have a specific orientation, be constructed and operated in a specific orientation, and therefore cannot be understood as a limitation of the present application. In addition, the terms "first", "second", "third", etc. are merely used for descriptive purposes, and cannot be understood as indicating or implying relative importance. "Vertical" is not strictly vertical, but within an allowable range of error. "Parallel" is not strictly parallel, but within an allowable range of error.

The words of orientation appearing in the following description are all directions shown in the figures, and do not limit the specific structure of the present application. In the description of the present application, it should also be noted that, unless otherwise clearly specified and limited, the terms "installing", "coupling", and "connecting" should be understood in a broad sense, for example, it can be a fixed connection, a detachable connection, or an integral connection; it can be directly connected, or indirectly connected through an intermediate medium. For those of ordinary skill in the art, the specific meanings of the above-mentioned terms in the present application can be understood according to specific circumstances.

It should be noted that, in the present application, relational terms, such as first and second, are used merely to distinguish one entity or operation from another entity or operation, without necessarily requiring or implying any actual such relationships or orders of these entities or operations. Moreover, the terms "comprise", "include", or any other variants thereof, are intended to represent a non-exclusive inclusion, such that a process, method, article or device including a series of elements includes not only those elements, but also other elements that are not explicitly listed or elements inherent to such a process, method, article or device. Without more constraints, the elements following an expression "comprise/include . . . " do not exclude the existence of additional identical elements in the process, method, article or device that includes the elements.

Embodiments of the present application provide a method, apparatus, device and medium for estimating performance parameters of a battery, which are suitable in a scenario of estimating performance parameters of the battery such as a current state of charge (State Of Charge, SOC) and a current battery capacity of the battery. For example, they can be used in a specific scenario where performance parameters of the battery such as the current SOC and current battery capacity are estimated when charging the battery. The battery in the embodiments of the present application may be a lithium ion power battery.

FIG. 1 is a schematic flowchart of a first method for estimating performance parameters of a battery provided by an embodiment of the present application. An execution subject of each step of the embodiment of the present application may be a battery management system (Battery Management System, BMS). As shown in FIG. 1, the method 100 for estimating performance parameters of a battery includes the following steps S101 to S104.

In S101, a first curve segment to be calibrated may be generated during a process of adjusting a battery capacity in a first capacity interval with a first capacity value as an endpoint value.

The first curve segment to be calibrated represents an actual change of the battery capacity in the first capacity interval with a voltage, that is, the first curve segment to be calibrated may be a curve segment with voltage as the abscissa and battery capacity as the ordinate. Specifically, since there is a certain positive correlation between a real-time capacitance of the battery and a real-time output voltage, correspondingly, the first curve segment to be calibrated may be an increasing curve. In other words, the larger the battery capacity value, the larger the corresponding voltage value.

First, for the first capacity interval, the first capacity interval is a capacity interval with the first capacity value Q1 and the fourth capacity value Q4 as two endpoints. If the first capacity value Q1 is a starting point and the fourth capacity value Q4 is an end point, the first capacity interval may be expressed as [Q1, Q4]. If the fourth capacity value Q4 is the starting point and the first capacity value Q1 is the end point, the first capacity interval may be expressed as [Q4, Q1].

In some embodiments, relative to a maximum capacity of the battery, the first capacity interval is a small interval. Specifically, a difference between the first capacity value Q1 and the fourth capacity value Q4, namely a size of the first capacity interval, may be determined according to a rated capacity Q0 of the battery or a maximum capacity of the battery, wherein the rated capacity Q0 of the battery may indicate a maximum power that the battery can store. Optionally, the difference between the first capacity value Q1 and the fourth capacity value Q4 is at least one order of magnitude smaller than the rated capacity Q0 of the battery, for example, the difference between the first capacity value Q1 and the fourth capacity value Q4 is equal to 5% Q0.

Second, for a specific method of generating the first curve segment to be calibrated, in one embodiment, in the process of adjusting the battery capacity in the first capacity interval with the first capacity value as the endpoint value, multiple pairs of voltages-battery capacity observation data may be collected, and then the first curve segment to be calibrated may be fit based on the multiple pairs of voltage-battery capacity observation data.

Exemplarily, methods such as a least squares method and a linear interpolation method may be used to fit the first curve segment to be calibrated. Specifically, taking the linear interpolation method as an example, if the obtained any two pairs of voltage-battery capacity observation data are (X1, Y1) and (X2, Y2) respectively, after selecting X3, Y3 may be derived linearly according to a linear fitting formula $(X3-X1)/(X2-X1)=(Y3-Y1)/(Y2-Y1)$. On the basis of knowing Y3, X3 may be derived linearly according to the above linear fitting formula. After obtaining enough voltage-battery capacity observation data pairs by the linear interpolation method, the first curve segment to be calibrated may be obtained by fitting.

Then, the process of adjusting the battery capacity may include a sub-process of constant current charging and/or a sub-process of constant current discharging. Optionally, constant current charging may refer to low current constant current charging, for example, a rate of constant current charging may be 0.04 C. The specific description of the process of adjusting the battery capacity is as follows.

First, during the process of adjusting the battery capacity in the first capacity interval, the battery capacity may only be adjusted to the fourth capacity value Q4, and the process of adjusting the battery capacity may be one of the following two situations.

(1). If the first capacity value Q1 is a starting value of the first capacity interval, the process of adjusting the battery capacity may be a charging sub-process of constant current charging from the first capacity value Q1 to the fourth capacity value Q4. Correspondingly, the first curve segment to be calibrated generated in the charging sub-process is a charging curve.

(2). If the first capacity value Q1 is an end value of the first capacity interval, the process of adjusting the battery capacity may be a discharging process of constant current discharging from the first capacity value Q1 to the fourth capacity value Q4. Correspondingly, the first curve segment to be calibrated generated during the process of adjusting the battery capacity in accordance with the first situation is a discharging curve.

Second, in the process of adjusting the battery capacity in the first capacity interval, in order to improve the accuracy of the first curve segment to be calibrated, the battery capacity may be adjusted to the fourth capacity value Q4 first, and then back to the first capacity value Q1, thereby generating a first charging curve segment and a first discharging curve segment, and then using the first charging curve segment and the first discharging curve segment for averaging processing to generate a charging and discharging curve segment.

Figure 2:
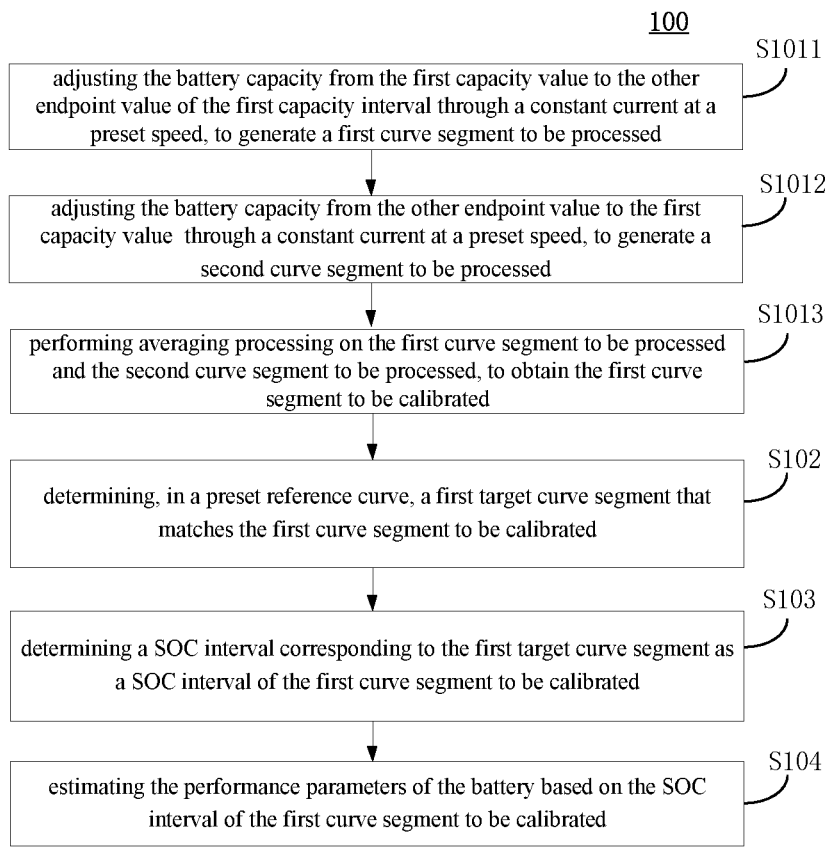
FIG. 2 is a schematic flowchart of a second method for estimating performance parameters of a battery provided by an embodiment of the present application.

Correspondingly, in some embodiments, FIG. 2 is a schematic flowchart of a second method for estimating performance parameters of a battery provided by an embodiment of the present application. As shown in FIG. 2, S101 may include S1011 to S1013.

In S1011, the battery capacity may be adjusted from the first capacity value Q1 to the other endpoint value Q4 of the first capacity interval through constant current charging or constant current discharging, to generate a first curve segment to be processed. Specifically, if the first capacity value Q1 is the starting value of the first capacity interval, then the first curve segment to be processed may be a charging curve segment. If the first capacity value Q1 is the end value of the first capacity interval, then the first curve segment to be processed may be a discharging curve segment.

In S1012, the battery capacity may be adjusted from the other endpoint value Q4 to the first capacity value Q1 through constant current charging or constant current discharging, to generate a second curve segment to be processed. Specifically, if the first capacity value Q1 is the starting value of the first capacity interval, then the second curve segment to be processed may be a discharging curve segment. If the first capacity value Q1 is the end value of the first capacity interval, then the second curve segment to be processed may be a charging curve segment.

In S1013, averaging processing may be performed on the first curve segment to be processed and the second curve segment to be processed to obtain the first curve segment to be calibrated.

Specifically, averaging processing may be to first determine N points on the first curve segment to be processed and the second curve segment to be processed respectively, wherein the N points on the first curve segment to be processed correspond to the N points on the second curve segment to be processed one by one. Then averaging processing are performed on N groups of corresponding points on the first curve segment to be processed and the second curve segment to be processed to obtain N points after averaging processing, and then the N points after averaging processing $C_1, \ldots, C_N$ are fit to obtain the first curve segment to be calibrated. For example, the abscissa of the i-th point $A_i$ $(X_i, Y_i)$ on the first curve segment to be processed may be equal to the abscissa of the i-th point $B_i$ $(X_i, Z_i)$ on the second curve segment to be processed. Then the coordinate of the point $C_i$ after averaging processing is $(X_i, (Y_i+Z_i)/2)$, wherein i is any integer less than or equal to N. For another example, the ordinate of the i-th point on the first curve segment to be processed may be equal to the ordinate of the i-th point $B_i$ of the second curve segment to be processed.

In S102, a first target curve segment that matches the first curve segment to be calibrated may be determined in a preset reference curve, wherein the preset reference curve represents a reference change of the battery capacity with a voltage within an output voltage range of the battery. The output voltage range of the battery may also be referred to as a voltage window of the battery.

First, for the preset reference curve, the preset reference curve may be a preset completed capacity-voltage curve. The preset reference curve represents the reference change of the battery capacity with a voltage within a full capacity range. The full capacity range represents a capacity range from 0 to a maximum battery capacity.

Specifically, the preset reference curve may be generated in a process of adjusting the battery capacity through constant current charging or constant current discharging within the full capacity range. A preset speed used in the process of generating the preset reference curve may be the same as a preset speed used in the process of generating the first curve segment to be calibrated, for example, both are 0.04 C.

In addition, a specific type of the preset reference curve may be a charging curve, a discharging curve, or a charging-discharging curve. First curve segments to be calibrated corresponding to different types of preset reference curves and the process of generating the first curve segments to be calibrated are different. The following is divided into three embodiments for description.

In one embodiment, if the preset reference curve is a charging curve, correspondingly, the first capacity interval may be set as a capacity curve with the first capacity value Q1 as a starting value, and during the process of generating the first curve segment to be calibrated, the battery capacity needs to be adjusted to the fourth capacity value Q4 by means of preset constant current charging.

In another embodiment, if the preset reference curve is a discharging curve, correspondingly, the first capacity interval may be set as a capacity curve with the first capacity value Q1 as an end value, and during the process of generating the first curve segment to be calibrated, the battery capacity needs to be adjusted to the fourth capacity value Q4 by means of preset constant current discharging.

In yet another embodiment, if the preset reference curve is a charging-discharging curve, correspondingly, the process of generating the first curve segment to be calibrated may refer to relevant contents of the above-mentioned embodiments S1011 to S1013 of the present application.

Figure 3:
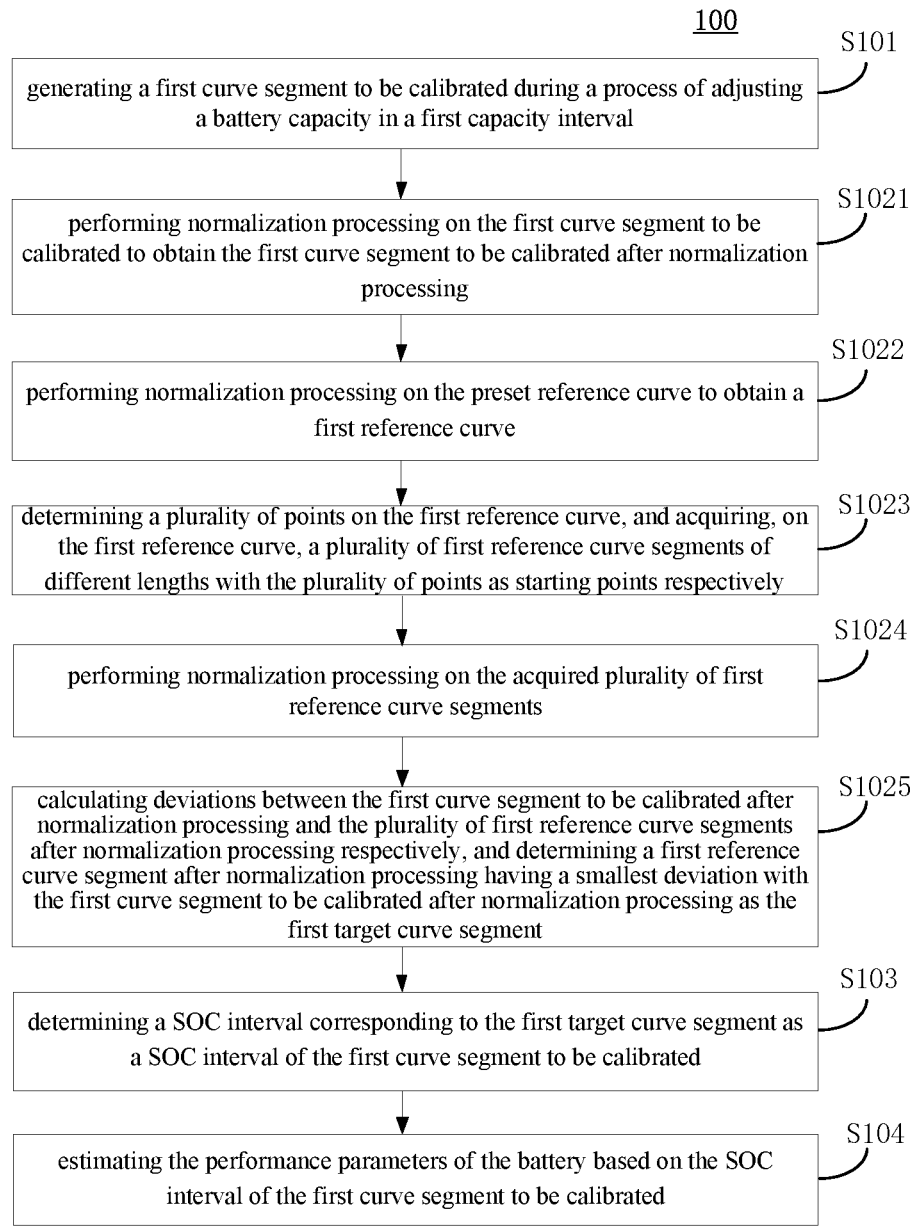
FIG. 3 is a schematic flowchart of a third method for estimating performance parameters of a battery provided by an embodiment of the present application.

Second, for the specific implementation of S102, in some embodiments, the preset reference curve may be a relatively long curve, for example, a length of a capacity range corresponding to the preset reference curve is Q0, and the first curve segment to be calibrated obtained by S101 is a relatively short curve segment, for example, a length of the first capacity interval corresponding to the first curve segment to be calibrated may be 5% Q0. Correspondingly, when matching the first curve segment to be calibrated with the preset reference curve, the preset reference curve may be divided into a plurality of small curve segments before matching. Specifically, FIG. 3 is a schematic flowchart of a third method for estimating performance parameters of a battery provided by an embodiment of the present application. As shown in FIG. 3, S102 may specifically include the following steps S1021 to S1025.

In S1021, normalization processing may be performed on the first curve segment to be calibrated to obtain the first curve segment to be calibrated after normalization processing.

In S1021, a capacity value of each point on the first curve segment to be calibrated may be mapped to an interval of [0, 1] through normalization processing. Optionally, the interval obtained by the mapping may be exactly [0, 1]. Exemplarily, if a capacity value range corresponding to the first curve segment to be calibrated is [Q4, Q1], then a capacity value range corresponding to the first curve segment to be calibrated after normalization processing is [0,1], and a voltage value range corresponding to the first curve segment to be calibrated before and after the normalization processing remains unchanged. In other words, a battery capacity value Qi corresponding to a point on the first curve segment to be calibrated becomes Qi/(Q1−Q4)+Q4 (Q1−Q4), but a voltage value corresponding to each point on the first curve segment to be calibrated has no change.

In some embodiments, in order to improve the accuracy, a curve segment may be intercepted from the first curve segment to be calibrated as a new first curve segment to be calibrated, and normalization processing may be performed on the new first curve segment to be calibrated. For example, a curve segment corresponding to [20%, 80%] of the first capacity interval may be intercepted as the new first curve segment to be calibrated. Exemplarily, if the first capacity interval is [Q4, Q1], then a new first capacity interval corresponding to the new first curve segment to be calibrated is [Q4+(Q1−Q4)×20%, Q1−(Q1−Q4)×20%].

In S1022, normalization processing may be performed on the preset reference curve to obtain a first reference curve, wherein the first reference curve represents a reference change of the SOC with a voltage.

It should be noted that the specific implementation of performing normalization processing on the preset reference curve may be the same as the specific implementation of performing normalization processing on the first curve segment to be calibrated in S1021, which will not be repeated here.

Exemplarily, if a capacity value range corresponding to the preset reference curve is [0, Q0], then for a capacity value Qi of any point in the preset reference curve, after normalization processing, a value of the ordinate of the point becomes Qi/Q0. Since Qi/Q0 is exactly the SOC value for this point, the first reference curve with voltage value as the abscissa and SOC as the ordinate is obtained by performing normalization processing on the preset reference curve.

In S1023, a plurality of points may be determined on the first reference curve, and a plurality of first reference curve segments of different lengths with the plurality of points as starting points may be acquired on the first reference curve respectively.

Exemplarily, if 10 points are determined on the first reference curve, and 5 first reference curve segments of different lengths are intercepted at each point, then a total of 50 first reference curve segments may be obtained.

Specifically, in order to facilitate calculation processing of the acquired first reference curve segments, the acquired first reference curve segments may be placed in a curve set.

In an embodiment, the specific implementation of S1023 includes the following two steps.

The first step is to determine, starting with a starting point of the first reference curve, a point on the first reference curve at every preset SOC distance.

That is to say, the plurality of points acquired on the first reference curve are equally spaced in the abscissa direction.

Exemplarily, if a value of the SOC of the first point M1 (namely the starting point of the first reference curve) may be a %, then a value of the SOC of the i-th point Mi may be a %+(i−1)b %. For example, if the first point M1 is the starting point of the first reference curve, then a may be 0. If a value of b is 5, then the acquired plurality of points may in turn be M1 (X1, 0%), M2 (X2, 5%), . . .

The second step is to acquire, for any point of the determined points, a plurality of first reference curve segments with the any point as a starting point on the first reference curve.

Lengthes of the plurality of first reference curve segments with the any point as a starting point are different preset lengthes. In an embodiment, a value range of lengthes of the plurality of first reference curve segments with the i-th point Mi as a starting point may be between [2.5%, 7.5%]. In the ordinate direction, the lengths of the plurality of first reference curve segments with the i-th point Mi as a starting point may form an arithmetic sequence. For example, a tolerance of the multiple lengths may be 0.5%, that is to say, taking the i-th point Mi as a starting point, 11 first reference curve segments may be selected, and a length of the j-th first reference curve segment is 2.5%+(j−1)0.5%, wherein j is a positive integer not greater than 11.

In S1024, normalization processing may be performed on the acquired plurality of first reference curve segments, so that a projection of the plurality of first reference curve segments after normalization processing on the ordinate is the same as a projection of the first curve segment to be calibrated after normalization processing on the ordinate.

The method of performing normalization processing on the first reference curve segments is the same as the method of performing normalization processing on the first curve segment to be calibrated, which will not be repeated here.

Exemplarily, if a battery capacity interval corresponding to the first reference curve segments is [a, b], then the battery capacity interval after normalization processing is [0, 1]. In other words, for a capacitance value k of any point on the reference curve segments, it is converted to k/(b−a)−a(b−a).

In S1025, deviations between the first curve segment to be calibrated after normalization processing and the plurality of first reference curve segments after normalization processing may be calculated respectively, and a first reference curve segment after normalization processing having a smallest deviation with the first curve segment to be calibrated after normalization processing may be determined as the first target curve segment.

Exemplarily, if N first reference curve segments are obtained through S1023, then the deviations $\Delta\delta_1, \ldots, \Delta\delta_N$ between the first curve segment to be calibrated and the N first reference curve segments may be calculated respectively, wherein $\Delta\delta_i$ is the deviation between the first curve segment to be calibrated and the i-th first reference curve segment, where i is any positive integer not greater than N.

If $\Delta\delta_1$ is the smallest, then the first first reference curve segment may be determined as the first target curve segment.

Specifically, when calculating the deviations between the first curve segment to be calibrated and any one of the first reference curve segments, L points may be selected on the first curve segment to be calibrated, and one-to-one corresponding L points may be selected on the first reference curve segments.

Exemplarily, the ordinate of the j -th point on the first curve segment to be calibrated is the same as the ordinate of the j-th point on the first reference curve segment, wherein j is a positive integer less than or equal to L. Then a difference between the two curves may be determined according to a difference between the corresponding points.

Exemplarily, the deviation between the first curve segment to be calibrated and the i-th first reference curve segment $\Delta\delta_i$ satisfies formula (1):

$$\Delta\delta_i = \sqrt[2]{\sum_{1}^{L}(X_{0j} - X_{ij})^2} \quad (1)$$

$\Delta\delta_i$ represents the deviation between the first curve segment to be calibrated and the i-th first reference curve segment, $X_{0j}$ represents a voltage value of the j-th point on the first curve segment to be calibrated, and $X_{ij}$ represents a voltage value of the j-th point on the i-th first reference curve segment.

It should be noted that an execution sequence between S1021 and S1022 to S1024 in the embodiment of the present application is not limited.

In S130, a SOC interval corresponding to the first target curve segment may be determined as a SOC interval of the first curve segment to be calibrated.

Exemplarily, the SOC interval corresponding to the first target curve segment is the SOC interval of the first reference curve segment of the first target curve segment before normalization processing. If the SOC interval of the first target curve segment is [SOCa, SOCb], then the SOC interval of the first curve segment to be calibrated is also [SOCa, SOCb].

In S140, the performance parameters of the battery may be estimated based on the SOC interval of the first curve segment to be calibrated, wherein the performance parameters include a current SOC and/or a current battery capacity.

According to the method, apparatus, device and medium for estimating performance parameters of a battery in the embodiments of the present application, the first curve segment to be calibrated may be generated by adjusting the battery capacity, the first target curve segment that matches the first curve segment to be calibrated may be matched from the reference curve segment, and the SOC interval of the first target curve segment is taken as the SOC interval of the first curve segment to be calibrated, and then the SOC interval of the first curve segment to be calibrated is used to estimate parameters such as the current SOC and current battery capacity of the battery. By matching the first target curve segment that matches the first curve segment to be calibrated from the reference curve segment, a curve segment corresponding to the first curve segment to be calibrated can be accurately found in the preset reference curve, and then performance parameters of the battery can be accurately estimated.

Since two performance parameters comprising the current SOC and current battery capacity may be calculated through S140, the following part of the present application will be divided into two embodiments, where the specific implementation of S140 when calculating the current SOC and the specific implementation of S140 when calculating the current battery capacity will be described in detail respectively.

Figure 4:
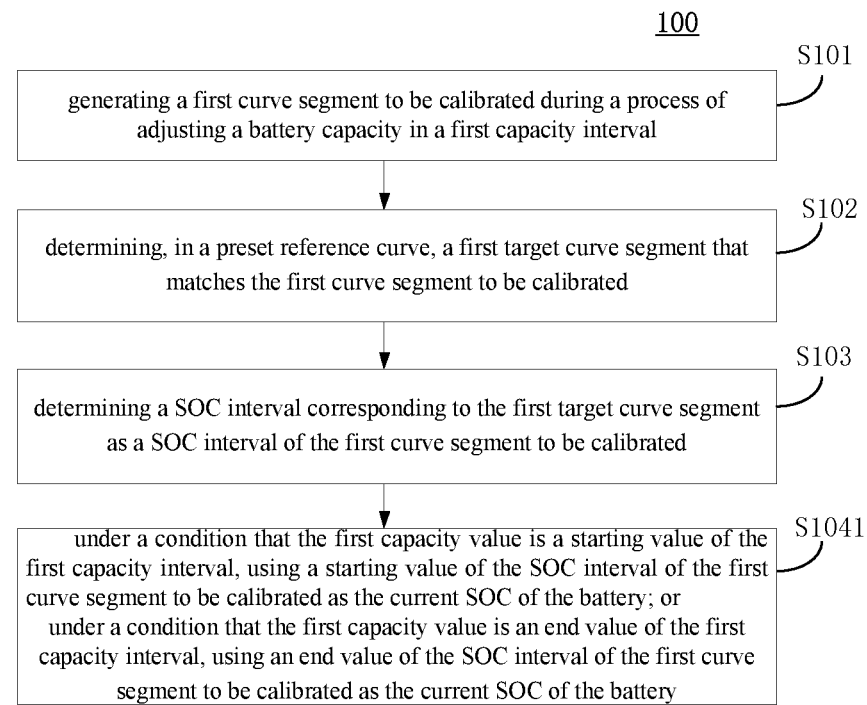
FIG. 4 is a schematic flowchart of a fourth method for estimating performance parameters of a battery provided by an embodiment of the present application.

In one embodiment, FIG. 4 is a schematic flowchart of a fourth method for estimating performance parameters of a battery provided by an embodiment of the present application. As shown in FIG. 4, when calculating the current SOC of the battery, the specific implementation of S140 may include S1041.

In S1041, if a first capacitance value is a starting value of the first capacity interval, then a starting value of the SOC interval of the first curve segment to be calibrated is used as the current SOC of the battery.

Exemplarily, if the first capacity interval is [Q1, Q4] and the SOC interval of the first target curve segment is [SOCa, SOCb], then the current SOC of the battery is SOCa.

Alternatively, if the first capacitance value is an end value of the first capacity interval, an end value of the SOC interval of the first curve segment to be calibrated is used as the current SOC of the battery.

Exemplarily, if the first capacity interval is [Q4, Q1] and the SOC interval of the first target curve segment is [SOCa, SOCb], then the current SOC of the battery is SOCb.

It should be noted that if the length of the first capacity interval is sufficiently small compared to a nominal capacity Q0 of the battery. For example, if the length of the first capacity interval is equal to 5% Q0, then a specific position of the first capacity value in the first capacity interval may be ignored. A reference point may be specified on the SOC interval of the first curve segment to be calibrated, and a value of the reference point may be taken as the current SOC. Exemplarily, a minimum value of the SOC interval of the first curve segment to be calibrated may be selected as the current SOC.

It should also be noted that traditional methods for estimating SOC include a charge accumulation method and an open circuit voltage method.

The charge accumulation method mainly has two problems. One problem is the dependence on an initial charge value. Since an error of the initial value itself cannot be corrected, the error of the initial value may continue to accumulate each time. The second problem is a problem of cumulative error. Since a current sensor has a poor accuracy and a low sampling frequency, and will also be interfered by noise signals, then a current during integration may have a certain deviation from a real current, which will lead to an error in an accumulation result. Therefore, compared with the charge accumulation method, the method for estimating performance parameters of a battery provided by embodiments of the present application can improve a calculation accuracy of the SOC.

The open circuit voltage method mainly has the following problems. One problem is that if the same material comes from different suppliers or different batches, its open circuit voltage (open circuit voltage, OCV) curve may be different. If only one fixed OCV curve is used, the calculation accuracy of the SOC will be affected. Therefore, compared with the open circuit voltage method, the method for estimating performance parameters of a battery provided by embodiments of the present application can improve a calculation accuracy of the SOC.

In another embodiment, the current battery capacity of the battery can be calculated by the following three calculation methods.

Figure 5:
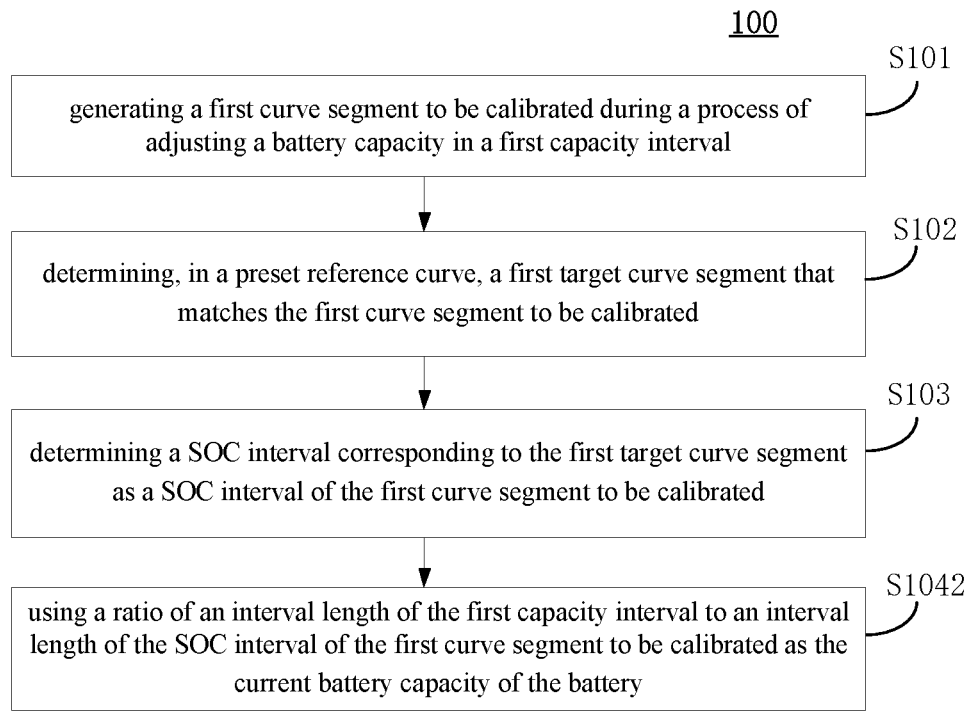
FIG. 5 is a schematic flowchart of a fifth method for estimating performance parameters of a battery provided by an embodiment of the present application.

The first calculation method: FIG. 5 is a schematic flowchart of a fifth embodiment of a method for estimating performance parameters of a battery according to the present application As shown in FIG. 5, the method for calculating the current battery capacity may be specifically implemented as S1042.

In S1042, if only the first curve segment to be calibrated is used to calculate the current battery capacity, a ratio of an interval length $|Q_1-Q_4|$ of the first capacity interval to an interval length of the SOC interval [SOCa, SOCb] of the first curve segment to be calibrated may be used as the current battery capacity of the battery.

Figure 6:
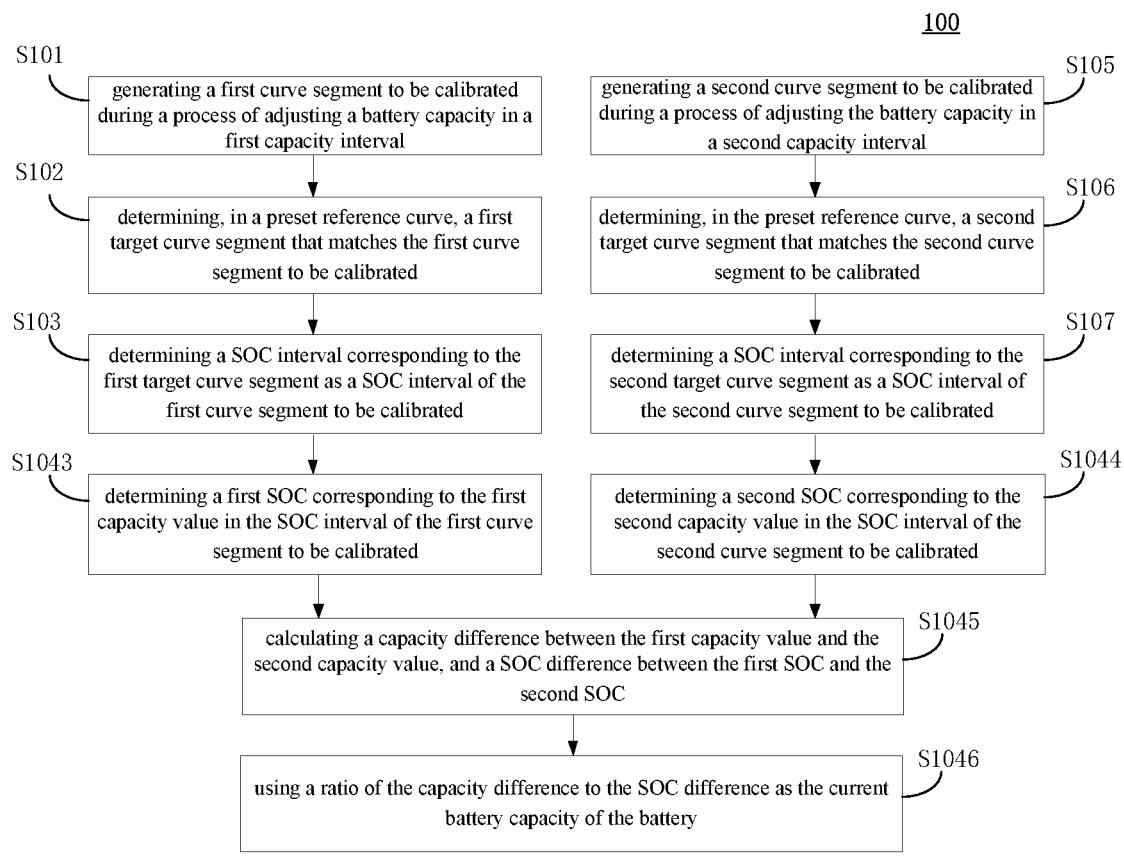
FIG. 6 is a schematic flowchart of a sixth method for estimating performance parameters of a battery provided by an embodiment of the present application.

The second calculation method: the current battery capacity may be determined by using a generated first curve segment to be calibrated and a generated second curve segment to be calibrated. Correspondingly, FIG. 6 is a schematic flowchart of a sixth method for estimating performance parameters of a battery provided by an embodiment of the present application. As shown in FIG. 6, before calculating the current battery capacity, the method further includes steps S105 to S107 of generating a second curve segment to be calibrated and determining a SOC interval of the second curve segment to be calibrated.

In S105, the second curve segment to be calibrated may be generated during a process of adjusting the battery capacity in a second capacity interval with a second capacity value as an endpoint value, wherein the second curve segment to be calibrated represents a change of the battery capacity in the second capacity interval with a voltage.

Specific contents of S105 may refer to related description of S101, which will not be repeated here. Optionally, a difference between the second capacity value and the first capacity value should be large enough, for example, the difference between them may be greater than 30% Q0. Exemplarily, if the first capacity value is 95% Q0, then an interval of selecting the second capacity value may be 0-75% Q0, for example, 20% Q0 or 60% Q0.

In S106, a second target curve segment that matches the second curve segment to be calibrated may be determined in the preset reference curve. Specific contents of S106 may refer to related description of S102, which will not be repeated here.

In S107, a SOC interval corresponding to the second target curve segment may be determined as the SOC interval of the second curve segment to be calibrated. Specific contents of S107 may refer to related description of S103, which will not be repeated here.

It should be noted that the embodiments of the present application does not limit an execution order between S101 to S103 and S105 to S107 that may optionally be executed synchronously or asynchronously. For example, S105 to S107 may be executed first, and then S101 to S103 may be executed.

Correspondingly, after obtaining the SOC interval of the second curve segment to be calibrated through S105 to S107, the method of calculating the current battery capacity may be specifically implemented as S1043 to S1046.

In S1043, a first SOC corresponding to the first capacity value Q1 may be determined in the SOC interval of the first curve segment to be calibrated.

Specific implementation of S1043 may refer to S1041, which will not be repeated here.

In S1044, a second SOC corresponding to the second capacity value Q2 may be determined in the SOC interval of the second curve segment to be calibrated.

Specific implementation of S1044 may refer to S1041, which will not be repeated here.

In S1044, a capacity difference Q1−Q2 between the first capacity value Q1 and the second capacity value Q2 may be calculated, and a SOC difference SOC1-SOC2 between the first SOC and the second SOC may be calculated.

In S1046, a ratio of the capacity difference to the SOC difference may be used as the current battery capacity of the battery. In other words, the current battery capacity Qc= (Q1−Q2)/(SOC1−SOC2).

The third calculation method: in order to further improve the calculation accuracy, a third calculation method may be extended on the basis of the second method. That is, in addition to the first curve segment to be calibrated and the second curve segment to be calibrated, one or more curve segments to be calibrated may be generated. If a total of N curve segments to be calibrated are generated, and the N curve segments to be calibrated are combined in pairs, then there are a total of $C_N^2$ combinations, and two curve segments to be calibrated in each combination may be called a curve segment pair. If M curve segment pairs are determined based on N curve segments to be calibrated, and each curve segment pair is used to calculate a current battery capacity, then an average value of M current battery capacities may be used as the current battery capacity. Exemplarily, if a total of three curve segments to be calibrated are generated, then a maximum of 3 curve segment pairs may be formed, namely, a curve segment pair consisting of the first curve segment to be calibrated and the second curve segment to be calibrated, a curve segment pair consisting of the first curve segment to be calibrated and a third curve segment to be calibrated, and a curve segment pair consisting of the second curve segment to be calibrated and the third curve segment to be calibrated.

Figure 7:
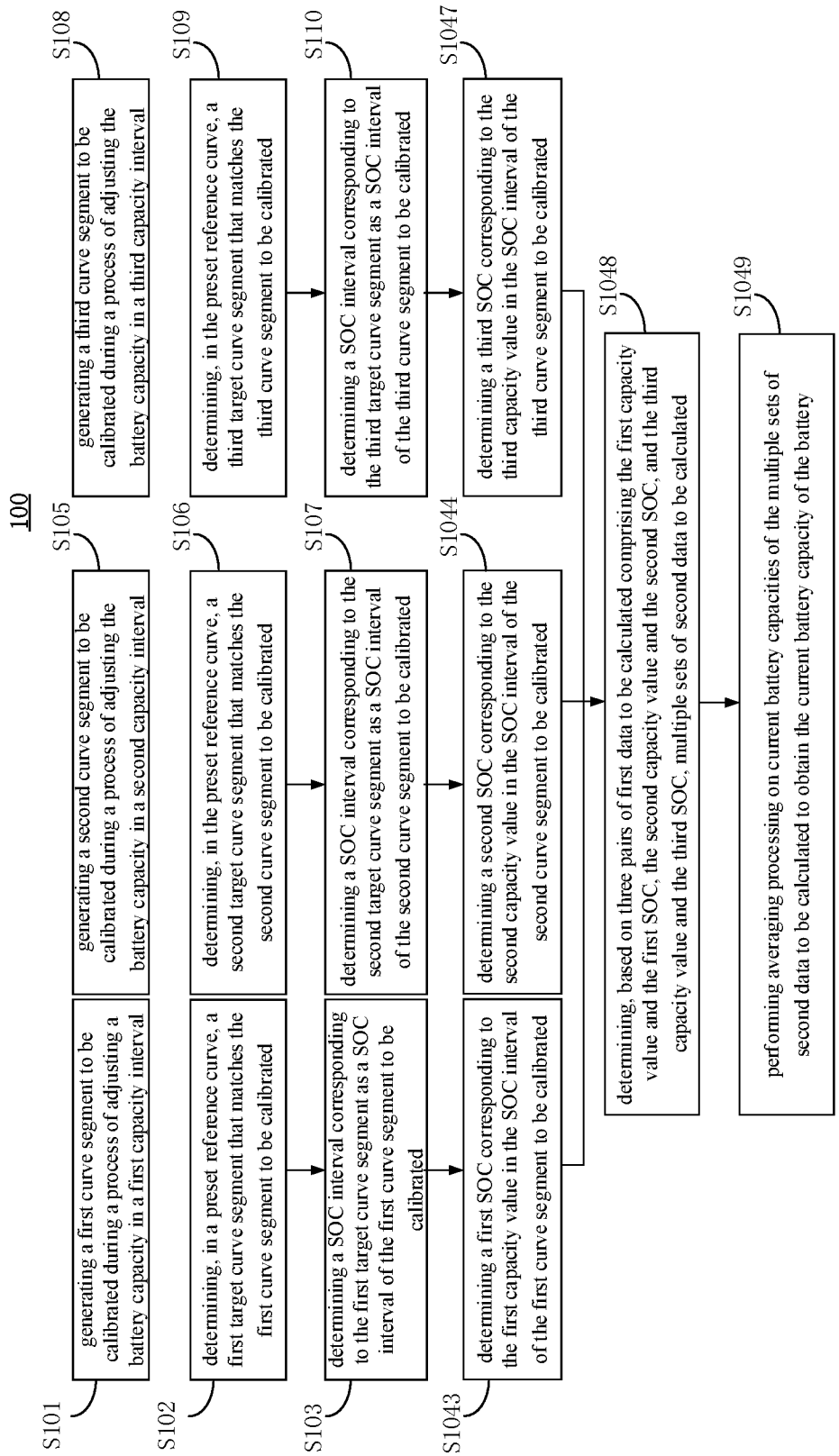
FIG. 7 is a schematic flowchart of a seventh method for estimating performance parameters of a battery provided by an embodiment of the present application.

In one embodiment, the current battery capacity may be calculated based on the first curve segment to be calibrated, the second curve segment to be calibrated, and the third curve segment. FIG. 7 is a schematic flowchart of a seventh method for estimating performance parameters of a battery provided by an embodiment of the present application. As shown in FIG. 7, before calculating the current battery capacity, the method further includes steps S108 to S110 of generating a third curve segment to be calibrated and determining a SOC interval of the third curve segment to be calibrated.

In S108, the third curve segment to be calibrated may be generated during a process of adjusting the battery capacity in a third capacity interval with a third capacity value as an endpoint value, wherein the third curve segment to be calibrated represents a change of the battery capacity in the third capacity interval with a voltage.

Specific contents of S108 may refer to relevant description of S101, which will not be repeated here. Optionally, values of the first capacity value, the second capacity value, and the third capacity value should be dispersed within a range of 0 to the maximum battery capacity as much as possible. Optionally, a difference between the second capacity value and the first capacity value should be sufficiently large. For example, a value range of the first capacity value may be 70% Q0-100% Q0, a value range of the second capacity value may be 30%-70% Q0, and a value range of the third capacity value may be 0%-40% Q0. For example, if the first capacity value is 95% Q0, then the second capacity value may be selected as 60% Q0, and the third capacity value may be selected as 20% Q0.

In S109, a third target curve segment that matches the third curve segment to be calibrated may be determined in the preset reference curve.

Specific contents of S109 may refer to related description of S102, which will not be repeated here.

In S110, a SOC interval corresponding to the third target curve segment may be determined as the SOC interval of the third curve segment to be calibrated.

Specific contents of S110 may refer to related description of S103, which will not be repeated here.

It should be noted that the embodiments of the present application does not limit an execution order among S101 to S103, S105 to S107, and S108 to S110 that may optionally be executed synchronously or asynchronously. For example, S108 to S110 may be executed first, then S105 to S107 may be executed, and finally S101 to S103 may be executed.

Correspondingly, after obtaining the SOC interval of the third curve segment to be calibrated through S108 to S110, the method of calculating the current battery capacity may be specifically implemented as S1043, S1044, S1047 to S1049.

In S1043: a first SOC corresponding to the first capacity value may be determined in the SOC interval of the first curve segment to be calibrated. Specific implementation of S1043 may refer to S1041, which will not be repeated here.

In S1044, a second SOC corresponding to the second capacity value may be determined in the SOC interval of the second curve segment to be calibrated. Specific implementation of S1044 may refer to S1041, which will not be repeated here.

In S1047, a third SOC corresponding to the third capacity value in the SOC interval of the third curve segment to be calibrated. Specific implementation of S1047 may refer to S1041, which will not be repeated here.

In S1048, based on three pairs of first data to be calculated comprising the first capacity value and the first SOC, the second capacity value and the second SOC, and the third capacity value and the third SOC, multiple sets of second data to be calculated may be determined, wherein each set of second data to be calculated includes any two pairs of the three pairs of first data to be calculated. Exemplarily, if three pairs of first data to be calculated comprising the first capacity value and the first SOC, the second capacity value and the second SOC, and the third capacity value and the third SOC are combined in pairs, a maximum of three sets of second data may be obtained, namely, a set of second data to be calculated consisting of the first capacity value and the first SOC, and the second capacity value and the second SOC, another set of second data to be calculated consisting of the first capacity value and the first SOC, and the third capacity value and the third SOC, and yet another set of second data to be calculated consisting of the second capacity value and the second SOC, and the third capacity value and the third SOC. Optionally, two sets of second data to be calculated may be selected.

In S1049, averaging processing may be performed on current battery capacities of the multiple sets of second data to be calculated to obtain the current battery capacity of the battery, wherein the current battery capacity of each set of second data to be calculated is a ratio of a difference of capacity values between the comprised two pairs of first data to be calculated to a difference of SOC between the comprised two pairs of first data to be calculated.

A method of calculating the current battery capacity of each set of second data to be calculated may refer to specific contents of S1042, which will not be repeated here. Exemplarily, a set of second data to be calculated consisting of the first capacity value and the first SOC, and the second capacity value and the second SOC may be used to calculate a current battery capacity Q1, and then another set of second data to be calculated consisting of the first capacity value and the first SOC, and the third capacity value and the third SOC may be used to calculate a current battery capacity Q2. Finally, an average value of Q1 and Q2 is used as the current battery capacity Qc.

Figure 8:
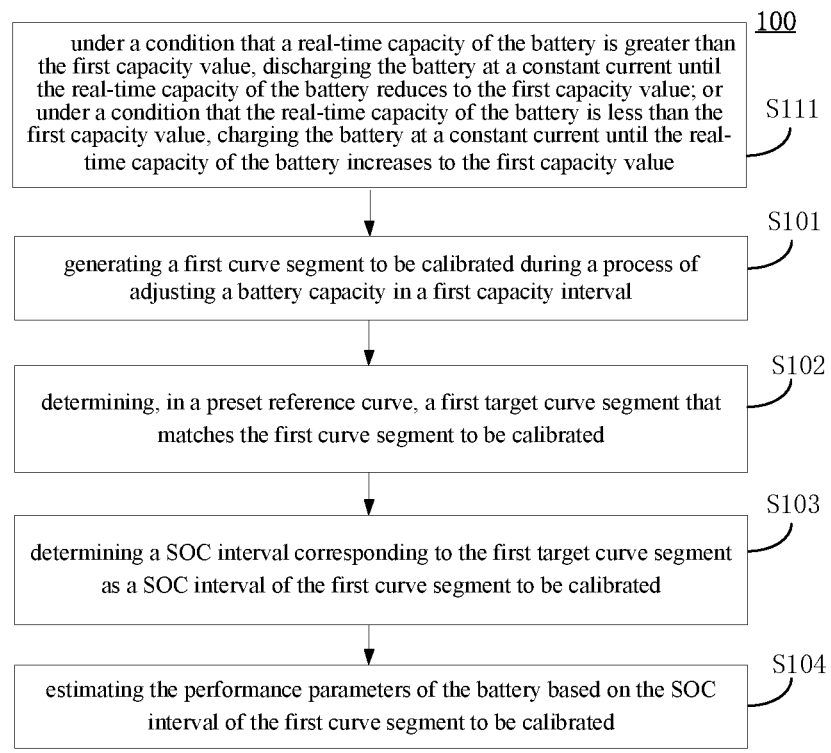
FIG. 8 is a schematic flowchart of an eighth method for estimating performance parameters of a battery provided by an embodiment of the present application.

In some embodiments, FIG. 8 is a schematic flowchart of an eighth method for estimating performance parameters of a battery provided by an embodiment of the present application. As shown in FIG. 8, before S101, the method for estimating performance parameters of a battery further includes S111.

In S111, if a real-time capacity of the battery is greater than the first capacity value, the battery may be discharged at a constant current until the real-time capacity of the battery reduces to the first capacity value. Or, if the real-time capacity of the battery is less than the first capacity value, the battery may be charged at a constant current until the real-time capacity of the battery increases to the first capacity value.

Through S111, the real-time capacity of the battery may be adjusted to a preset first capacity value, which facilitates subsequent calculation of performance parameters of the battery. Optionally, a constant current charging and discharging rate in S111 is the same as a constant current charging and discharging rate in S101.

Figure 9:
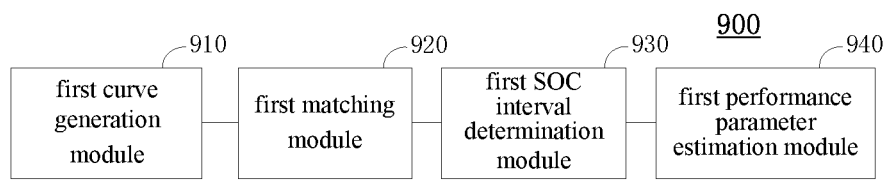
FIG. 9 is a schematic structural diagram of an apparatus for estimating performance parameters of a battery provided by an embodiment of the present application.

Based on the same inventive concept, an embodiment of the present application provides an apparatus for estimating performance parameters of a battery. FIG. 9 is a schematic structural diagram of an apparatus for estimating performance parameters of a battery provided by an embodiment of the present application. As shown in FIG. 9, the apparatus for estimating performance parameters of a battery 900 includes: a first curve generation module 910, a first matching module 920, a first SOC interval determination module 930, and a first performance parameter estimation module 940.

The first curve generation module 910 is configured to generate a first curve segment to be calibrated during a process of adjusting a battery capacity in a first capacity interval with a first capacity value as an endpoint value, wherein the first curve segment to be calibrated represents an actual change of the battery capacity in the first capacity interval with a voltage.

The first matching module 920 is configured to determine, in a preset reference curve, a first target curve segment that matches the first curve segment to be calibrated, wherein the preset reference curve represents a reference change of the battery capacity with a voltage within an output voltage range of the battery.

The first SOC interval determination module 930 is configured to determine a SOC interval corresponding to the first target curve segment as a SOC interval of the first curve segment to be calibrated.

The first performance parameter estimation module 940 is configured to estimate the performance parameters of the battery based on the SOC interval of the first curve segment to be calibrated, wherein the performance parameters comprise a current SOC and/or a current battery capacity.

In some embodiments, the performance parameters include the current SOC. Correspondingly, the first performance parameter estimation module 940 is specifically configured to: under a condition that a first capacitance value is a starting value of the first capacity interval, use a starting value of the SOC interval of the first curve segment to be calibrated as the current SOC of the battery; or under a condition that the first capacity value is an end value of the first capacity interval, using an end value of the SOC interval of the first curve segment to be calibrated as the current SOC of the battery.

In some embodiments, the performance parameters include the current battery capacity. Correspondingly, the first performance parameter estimation module 940 is specifically configured to use a ratio of an interval length of the first capacity interval to an interval length of the SOC interval of the first curve segment to be calibrated as the current battery capacity.

In some embodiments, the apparatus for estimating performance parameters of a battery 900 further includes a second curve generation module, a second matching module, and a second SOC interval determination module.

The second curve generation module is configured to generate a second curve segment to be calibrated during a process of adjusting the battery capacity in a second capacity interval with a second capacity value as an endpoint value, wherein the second curve segment to be calibrated represents a change of the battery capacity in the second capacity interval with a voltage.

The second matching mode is configured to determine, in the preset reference curve, a second target curve segment that matches the second curve segment to be calibrated.

The second SOC interval determination module is configured to determine a SOC interval corresponding to the second target curve segment as a SOC interval of the second curve segment to be calibrated.

In some embodiments, the performance parameters include the current battery capacity. Correspondingly, the first performance parameter estimation module 940 is specifically configured to perform the following steps: determining a first SOC corresponding to the first capacity value in the SOC interval of the first curve segment to be calibrated; determining a second SOC corresponding to the second capacity value in the SOC interval of the second curve segment to be calibrated; calculating a capacity difference between the first capacity value and the second capacity value, and a SOC difference between the first SOC and the second SOC; and using a ratio of the capacity difference to the SOC difference as the current battery capacity of the battery.

In some embodiments, the apparatus for estimating performance parameters of a battery 900 further includes a third curve generation module, a third matching module, and a third SOC interval determination module.

The third curve generation module is configured to generate a third curve segment to be calibrated during a process of adjusting the battery capacity in a third capacity interval with a third capacity value as an endpoint value, wherein the third curve segment to be calibrated represents a change of the battery capacity in the third capacity interval with a voltage.

The third matching module is configured to determine, in the preset reference curve, a third target curve segment that matches the third curve segment to be calibrated.

The third SOC interval determination module is configured to determine a SOC interval corresponding to the third target curve segment as a SOC interval of the third curve segment to be calibrated.

In some embodiments, the performance parameters include the current battery capacity. Correspondingly, the first performance parameter estimation module 940 is specifically configured to perform the following steps: determining a first SOC corresponding to the first capacity value in the SOC interval of the first curve segment to be calibrated; determining a second SOC corresponding to the second capacity value in the SOC interval of the second curve segment to be calibrated; determining a third SOC corresponding to the third capacity value in the SOC interval of the third curve segment to be calibrated; determining, based on three pairs of first data to be calculated comprising the first capacity value and the first SOC, the second capacity value and the second SOC, and the third capacity value and the third SOC, multiple sets of second data to be calculated, each set of second data to be calculated comprising any two pairs of the three pairs of first data to be calculated; and performing averaging processing on current battery capacities of the multiple sets of second data to be calculated to obtain the current battery capacity of the battery, wherein the current battery capacity of each set of second data to be calculated is a ratio of a difference of capacity values between the comprised two pairs of first data to be calculated to a difference of SOC between the comprised two pairs of first data to be calculated.

In some embodiments, the apparatus for estimating performance parameters of a battery 900 further includes an adjustment module.

The adjustment module is configured to: under a condition that a real-time capacity of the battery is greater than the first capacity value, discharge the battery at a constant current until the real-time capacity of the battery reduces to the first capacity value; or under a condition that the real-time capacity of the battery is less than the first capacity value, charge the battery at a constant current until the real-time capacity of the battery increases to the first capacity value.

In some embodiments, the first curve generation module 910 is specifically configured to perform the following steps: adjusting the battery capacity from the first capacity value to the other endpoint value of the first capacity interval through constant current charging or constant current discharging, to generate a first curve segment to be processed; adjusting the battery capacity from the other endpoint value to the first capacity value through constant current charging or constant current discharging, to generate a second curve segment to be processed; and performing averaging processing on the first curve segment to be processed and the second curve segment to be processed, to obtain the first curve segment to be calibrated.

In some embodiments, the first matching module 920 is specifically configured to perform the following steps: performing normalization processing on the first curve segment to be calibrated to obtain the first curve segment to be calibrated after normalization processing; performing normalization processing on the preset reference curve to obtain a first reference curve, wherein the first reference curve represents a reference change of the SOC with a voltage; determining a plurality of points on the first reference curve, and acquiring, on the first reference curve, a plurality of first reference curve segments of different lengths with the plurality of points as starting points respectively; performing normalization processing on the acquired plurality of first reference curve segments, so that a projection of the plurality of first reference curve segments after normalization processing on an ordinate is the same as a projection of the first curve segment to be calibrated after normalization processing on the ordinate; and calculating deviations between the first curve segment to be calibrated after normalization processing and the plurality of first reference curve segments after normalization processing respectively, and determining a first reference curve segment after normalization processing having a smallest deviation with the first curve segment to be calibrated after normalization processing as the first target curve segment.

In some embodiments, the first matching module 920 is specifically configured to: determine a point on the first reference curve at every preset SOC distance from a starting point of the first reference curve; and acquire, for any point of the determined points, a plurality of first reference curve segments with the any point as a starting point on the first reference curve, wherein lengthes of the plurality of first reference curve segments with the any point as a starting point are different preset lengthes.

In some embodiments, a capacity interval of the first curve segment to be calibrated after normalization processing is [0, 1].

According to the apparatus for estimating performance parameters of a battery in the embodiments of the present application, the first curve segment to be calibrated may be generated by adjusting the battery capacity, the first target curve segment that matches the first curve segment to be calibrated may be matched from the reference curve segment, and the SOC interval of the first target curve segment is taken as the SOC interval of the first curve segment to be calibrated, and then the SOC interval of the first curve segment to be calibrated is used to estimate parameters such as the current SOC and current battery capacity of the battery. By matching the first target curve segment that matches the first curve segment to be calibrated from the reference curve segment, a curve segment corresponding to the first curve segment to be calibrated can be accurately found in the preset reference curve, and then performance parameters of the battery can be accurately estimated.

Other details of the apparatus for estimating performance parameters of a battery according to the embodiments of the present application are similar to the method for estimating performance parameters of a battery according to the embodiments of the present application described above in conjunction with FIGS. 1 to 8, which will not be repeated here.

Figure 10:
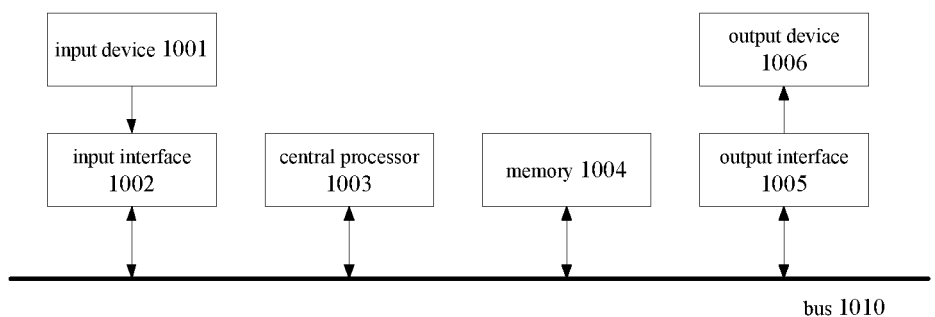
FIG. 10 is a structural diagram of an exemplary hardware architecture of a device for estimating performance parameters of a battery provided by an embodiment of the present application.

FIG. 10 is a structural diagram of an exemplary hardware architecture of a device for estimating performance parameters of a battery provided by an embodiment of the present application.

As shown in FIG. 10, the device for estimating performance parameters of a battery 1000 includes an input device 1001, an input interface 1002, a central processor 1003, a memory 1004, an output interface 1005, and an output device 1006. The input interface 1002, the central processor 1003, the memory 1004, and the output interface 1005 are connected to each other through a bus 1010, and the input device 1001 and the output device 1006 are connected to the bus 1010 through the input interface 1002 and the output interface 1005 respectively, and in turn connected to other components of the device for estimating performance parameters of a battery 1000.

Specifically, the input device 1001 receives input information from the outside, and transmits the input information to the central processor 1003 through the input interface 1002; the central processor 1003 processes the input information based on computer executable instructions stored in the memory 1004 to generate output information, stores the output information temporarily or permanently in the memory 1004, and then transmits the output information to the output device 1006 through the output interface 1005; the output device 1006 outputs the output information to the outside of the device for estimating performance parameters of a battery 1000 for a user to use.

That is, the device for estimating performance parameters of a battery shown in FIG. 10 may also be implemented as including: a memory storing computer executable instructions; and a processor that may implement the method for estimating performance parameters of a battery described in conjunction with FIGS. 1 to 8 when executing the computer executable instructions.

The embodiments of the present application also provide a computer storage medium having computer program instructions stored thereon that, when executed by a processor, implement the method for estimating performance parameters of a battery according to the embodiments of the present application.

It should be clear that the present application is not limited to the specific configuration and processing described above and shown in the drawings. For the sake of brevity, a detailed description of the known methods is omitted here. In the above embodiments, several specific steps are described and shown as examples. However, the method process of the present application is not limited to the specific steps described and shown, and those skilled in the art can make various changes, modifications and additions, or change the order between the steps after understanding the spirit of the present application.

Functional blocks shown in the above structural block diagrams may be implemented as hardware, software, firmware, or a combination thereof. When implemented in hardware, the functional blocks may be, for example, an electronic circuit, an Application Specific Integrated Circuit (ASIC), a suitable firmware, a plug-in, a function card and the like. When implemented in software, elements of the present application may be programs or code segments used to perform the required tasks. The programs or code segments may be stored in a machine-readable medium or transmitted over a transmission medium or a communication link via data signals carried in carriers. The "machine-readable medium" may include any medium capable of storing or transmitting information. Examples of the machine-readable medium include an electronic circuit, a semiconductor memory device, a ROM, a flash memory, an erasable ROM (EROM), a floppy disk, a CD-ROM, an optical disk, a hard disk, a fiber optic medium, a radio frequency (RF) link, and so on. The code segments may be downloaded via a computer network such as the Internet, an intranet, and so on.

The above is only detailed description of the present application. Those skilled in the art can clearly understand that, for the convenience and conciseness of description, the specific working process of the above-described systems, modules, and units may refer to corresponding process in the foregoing methods embodiments, which will not be repeated here.

Although the present application has been described with reference to preferred embodiments, various modifications may be made thereto and components thereof may be replaced with their equivalents, without departing from the scope of the present application. In particular, as long as there is no structural conflict, various technical features mentioned in various embodiments can be combined in any manner. The present application is not limited to the specific embodiments disclosed herein, and instead, includes all the technical solutions that fall within the scope of the claims.

What is claimed is:

1. A method for estimating performance parameters of a battery, comprising:
    generating a first curve segment to be calibrated during a process of adjusting a battery capacity in a first capacity interval with a first capacity value as an endpoint value, wherein the first curve segment to be calibrated represents an actual change of the battery capacity in the first capacity interval with a voltage;

determining, in a preset reference curve, a first target curve segment that matches the first curve segment to be calibrated, wherein the preset reference curve represents a reference change of the battery capacity with a voltage within an output voltage range of the battery;

determining a state of charge (SOC) interval corresponding to the first target curve segment as a SOC interval of the first curve segment to be calibrated; and estimating the performance parameters of the battery based on the SOC interval of the first curve segment to be calibrated, wherein the performance parameters comprise a current SOC and/or a current battery capacity, wherein the method further comprises:

generating a second curve segment to be calibrated during a process of adjusting the battery capacity in a second capacity interval with a second capacity value as an endpoint value, wherein the second curve segment to be calibrated represents a change of the battery capacity in the second capacity interval with a voltage;

determining, in the preset reference curve, a second target curve segment that matches the second curve segment to be calibrated;

determining a SOC interval corresponding to the second target curve segment as a SOC interval of the second curve segment to be calibrated, generating a third curve segment to be calibrated during a process of adjusting the battery capacity in a third capacity interval with a third capacity value as an endpoint value, wherein the third curve segment to be calibrated represents a change of the battery capacity in the third capacity interval with a voltage;

determining, in the preset reference curve, a third target curve segment that matches the third curve segment to be calibrated; and determining a SOC interval corresponding to the third target curve segment as a SOC interval of the third curve segment to be calibrated, wherein the performance parameters comprise the current battery capacity, and estimating the performance parameters of the battery based on the SOC interval of the first curve segment to be calibrated comprises:

determining a first SOC corresponding to the first capacity value in the SOC interval of the first curve segment to be calibrated;

determining a second SOC corresponding to the second capacity value in the SOC interval of the second curve segment to be calibrated;

determining a third SOC corresponding to the third capacity value in the SOC interval of the third curve segment to be calibrated;

determining, based on three pairs of first data to be calculated comprising the first capacity value and the first SOC, the second capacity value and the second SOC, and the third capacity value and the third SOC, multiple sets of second data to be calculated, each set of second data to be calculated comprising any two pairs of the three pairs of first data to be calculated; and performing averaging processing on current battery capacities of the multiple sets of second data to be calculated to obtain the current battery capacity of the battery, wherein the current battery capacity of each set of second data to be calculated is a ratio of a difference of capacity values between the comprised two pairs of first data to be calculated to a difference of SOC between the comprised two pairs of first data to be calculated.

2. The method according to claim 1, wherein the performance parameters comprise the current SOC, and estimating the performance parameters of the battery based on the SOC interval of the first curve segment to be calibrated comprises:

under a condition that the first capacity value is a starting value of the first capacity interval, using a starting value of the SOC interval of the first curve segment to be calibrated as the current SOC of the battery; or under a condition that the first capacity value is an end value of the first capacity interval, using an end value of the SOC interval of the first curve segment to be calibrated as the current SOC of the battery.

3. The method according to claim 1, wherein the performance parameters comprise the current battery capacity, and estimating the performance parameters of the battery based on the SOC interval of the first curve segment to be calibrated comprises:

using a ratio of an interval length of the first capacity interval to an interval length of the SOC interval of the first curve segment to be calibrated as the current battery capacity.

4. The method according to claim 1, wherein before the generating a first curve segment to be calibrated during a process of adjusting a battery capacity in a first capacity interval with a first capacity value as an endpoint value, the method further comprises:

under a condition that a real-time capacity of the battery is greater than the first capacity value, discharging the battery until the real-time capacity of the battery reduces to the first capacity value; or under a condition that the real-time capacity of the battery is less than the first capacity value, charging the battery until the real-time capacity of the battery increases to the first capacity value.

5. The method according to claim 1, wherein the generating a first curve segment to be calibrated during a process of adjusting a battery capacity in a first capacity interval with a first capacity value as an endpoint value comprises:

adjusting the battery capacity from the first capacity value to the other endpoint value of the first capacity interval through constant current charging or constant current discharging, to generate a first curve segment to be processed;

adjusting the battery capacity from the other endpoint value to the first capacity value through constant current charging or constant current discharging, to generate a second curve segment to be processed; and performing averaging processing on the first curve segment to be processed and the second curve segment to be processed, to obtain the first curve segment to be calibrated.

6. The method according to claim 1, wherein the determining, in a preset reference curve, a first target curve segment that matches the first curve segment to be calibrated comprises:

performing normalization processing on the first curve segment to be calibrated to obtain the first curve segment to be calibrated after normalization processing;

performing normalization processing on the preset reference curve to obtain a first reference curve, wherein the first reference curve represents a reference change of the SOC with a voltage;

determining a plurality of points on the first reference curve, and acquiring, on the first reference curve, a plurality of first reference curve segments of different lengths with the plurality of points as starting points respectively;

performing normalization processing on the acquired plurality of first reference curve segments, so that a projection of the plurality of first reference curve segments after normalization processing on an ordinate is the same as a projection of the first curve segment to be calibrated after normalization processing on the ordinate; and calculating deviations between the first curve segment to be calibrated after normalization processing and the plurality of first reference curve segments after normalization processing respectively, and determining a first reference curve segment after normalization processing having a smallest deviation with the first curve segment to be calibrated after normalization processing as the first target curve segment.

7. The method according to claim 6, wherein the determining a plurality of points on the first reference curve, and acquiring, on the first reference curve, a plurality of first reference curve segments of different lengths with the plurality of points as starting points respectively comprises:

determining a point on the first reference curve at every preset SOC distance from a starting point of the first reference curve; and acquiring, for any point of the determined points, a plurality of first reference curve segments with the any point as a starting point on the first reference curve, wherein lengthes of the plurality of first reference curve segments with the any point as a starting point are different preset lengthes.

8. The method according to claim 6, wherein a capacity interval of the first curve segment to be calibrated after normalization processing is [0, 1].

9. A device for estimating performance parameters of a battery, comprising:

a memory configured to store a program; and a processor configured to run the program stored in the memory to implement the method for estimating performance parameters of a battery according to claim 1.

10. A non-transitory, tangible computer readable storage medium having computer program instructions stored thereon that, when executed by a processor, implement the method for estimating performance parameters of a battery according to claim 1.

11. An apparatus for estimating performance parameters of a battery, comprising:

a first curve generation module configured to generate a first curve segment to be calibrated during a process of adjusting a battery capacity in a first capacity interval with a first capacity value as an endpoint value, wherein the first curve segment to be calibrated represents an actual change of the battery capacity in the first capacity interval with a voltage;

a first matching module configured to determine, in a preset reference curve, a first target curve segment that matches the first curve segment to be calibrated, wherein the preset reference curve represents a reference change of the battery capacity with a voltage within an output voltage range of the battery;

a first SOC interval determination module configured to determine a state of charge (SOC) interval corresponding to the first target curve segment as a SOC interval of the first curve segment to be calibrated; and a first performance parameter estimation module configured to estimate the performance parameters of the battery based on the SOC interval of the first curve segment to be calibrated, wherein the performance parameters comprise a current SOC and/or a current battery capacity, wherein the apparatus further comprises:

a second curve generation module configured to generate a second curve segment to be calibrated during a process of adjusting the battery capacity in a second capacity interval with a second capacity value as an endpoint value, wherein the second curve segment to be calibrated represents a change of the battery capacity in the second capacity interval with a voltage;

a second matching module configured to determine, in the preset reference curve, a second target curve segment that matches the second curve segment to be calibrated;

a second SOC interval determination module configured to determine a SOC interval corresponding to the second target curve segment as a SOC interval of the second curve segment to be calibrated, a third curve generation module configured to generate a third curve segment to be calibrated during a process of adjusting the battery capacity in a third capacity interval with a third capacity value as an endpoint value, wherein the third curve segment to be calibrated represents a change of the battery capacity in the third capacity interval with a voltage;

a third matching module configured to determine, in the preset reference curve, a third target curve segment that matches the third curve segment to be calibrated; and a third SOC interval determination module configured to determine a SOC interval corresponding to the third target curve segment as a SOC interval of the third curve segment to be calibrated, wherein the performance parameters comprise the current battery capacity, and the first performance parameter estimation module is further configured to:

determine a first SOC corresponding to the first capacity value in the SOC interval of the first curve segment to be calibrated;

determine a second SOC corresponding to the second capacity value in the SOC interval of the second curve segment to be calibrated;

determine a third SOC corresponding to the third capacity value in the SOC interval of the third curve segment to be calibrated;

determine, based on three pairs of first data to be calculated comprising the first capacity value and the first SOC, the second capacity value and the second SOC, and the third capacity value and the third SOC, multiple sets of second data to be calculated, each set of second data to be calculated comprising any two pairs of the three pairs of first data to be calculated; and perform averaging processing on current battery capacities of the multiple sets of second data to be calculated to obtain the current battery capacity of the battery, wherein the current battery capacity of each set of second data to be calculated is a ratio of a difference of capacity values between the comprised two pairs of first data to be calculated to a difference of SOC between the comprised two pairs of first data to be calculated.

\* \* \* \* \*